(12) United States Patent
Grüning et al.

(10) Patent No.: US 6,468,348 B1
(45) Date of Patent: Oct. 22, 2002

(54) METHOD OF PRODUCING AN OPEN FORM

(75) Inventors: Ulrike Grüning, Wappingers Falls, NY (US); Hermann Wendt, Grasbrunn (DE); Volker Lehmann, München (DE); Reinhard Stengl, Stadtbergen (DE); Hans Reisinger, Grünwald (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/539,237

(22) Filed: Mar. 30, 2000

Related U.S. Application Data

(63) Continuation of application No. PCT/DE98/02450, filed on Aug. 21, 1998.

(30) Foreign Application Priority Data

Sep. 30, 1997 (DE) .......................................... 197 43 296

(51) Int. Cl.$^7$ .............................................. C30B 25/04
(52) U.S. Cl. ...................... 117/94; 117/96; 117/934; 372/43; 372/44; 385/129; 385/146
(58) Field of Search .......................... 117/94, 96, 934; 372/43, 44; 385/146, 129

(56) References Cited

U.S. PATENT DOCUMENTS

| | | | |
|---|---|---|---|
| 5,406,573 A | * | 4/1995 | Ozbay et al. ................. 372/43 |
| 5,431,777 A | | 7/1995 | Austin et al. |
| 5,600,483 A | | 2/1997 | Fan et al. |
| 5,987,208 A | * | 11/1999 | Gruning et al. ............. 385/146 |
| 6,042,998 A | * | 3/2000 | Brueck et al. .............. 430/316 |
| 6,093,246 A | * | 7/2000 | Lin et al. .................... 117/928 |

FOREIGN PATENT DOCUMENTS

DE            195 26 734 A1       1/1997

OTHER PUBLICATIONS

"Novel applications of phonotic band gap materials: Low–loss bends and high Q cavities", (Meade et al.), dated Jan. 6, 1994, Journal of Applied Physics 75, pp. 4753–4755, as mentioned on p. 3 of the specification.

"Phonotic Band Gaps and Localization" (Soukoulis), dated 1993, Plenum Press, New York and London, pp. 207–234, as mentioned on p. 3 of the specification.

* cited by examiner

*Primary Examiner*—Robert Kunemund
(74) *Attorney, Agent, or Firm*—Laurence A. Greenberg; Werner H. Stemer; Gregory L. Mayback

(57) ABSTRACT

An open form is produced with a plurality of in each case two-dimensionally structured layers. The form is made of silicon which is etchable in dependence on its doping. A first silicon layer is first produced, and a portion of the first layer which belongs to the form to be produced, is marked by doping at least one zone of the first layer. Subsequently, at least one further silicon layer is applied, and a portion belonging to the form is also marked therein. Finally, every unmarked portion of the layers is removed by etching depending on the respective doping of each layer. The open form is, in particular, a photonic crystal.

9 Claims, 2 Drawing Sheets

METHOD OF PRODUCING AN OPEN FORM

CROSS-REFERENCE TO RELATED APPLICATION

This is a continuation of copending International Application PCT/DE98/02450, filed Aug. 21, 1998, which designated the United States.

BACKGROUND OF THE INVENTION

FIELD OF THE INVENTION

The invention relates to a method for the production of an open form composed of a plurality of layers which are each two-dimensionally structured. The form is made of a material which can be etched depending on its doping.

The invention relates, in particular, to the production of an open form which is suitable as a "photonic crystal".

In the context of this description, an open form is understood to mean a form having a non-convex geometry. An open form may have, in particular, a geometry that is not simply connected in the sense of the conventional topology, that is to say be provided with a hole, a channel bounded in two dimensions, a plurality of holes or the like.

Such an open form may, under certain circumstances, function as a photonic crystal, i.e. as a more or less periodic, as it were crystalline structure which, with regard to the transmission of photons (light) behaves like a crystalline semiconductor, in the conventional sense, with regard to the transmission of electrons. A photonic crystal may, under certain circumstances, have a "photonic band gap" by analogy with a semiconductor having an "electronic band gap"; this means that the photonic crystal is impervious to a photon having an energy within the photonic band gap. This means that the photonic crystal acts as an essentially perfect mirror for such a photon, if the latter falls onto the crystal from outside. It is this property that explains the interest in photonic crystals for bounding optical waveguides or optical cavity resonators, because unlike a conventionally used means for bounding an optical waveguide or cavity resonator by means of a totally reflecting arrangement, the reflecting property of a photonic crystal is independent of an angle at which a photon to be reflected impinges on the photonic crystal.

An open form designed as a photonic crystal and a method for its production are described in the PCT publication WO 97/04340 A1. The open form is composed of silicon as the material and is produced by means of electrochemical etching. WO 97/04340 A1 also mentions gallium arsenide and aluminum gallium arsenide as suitable materials; the desired open structure can be produced in such a material by reactive ion etching.

A broad overview of the technical field of photonic crystals is provided by the paper "Photonic Band Structure" by E. Yablonovitch, contained in the book edited by C. M. Soukoulis "Photonic Band Gaps and Localization", Plenum Press, New York, N.Y., 1993, pages 207 et seq. One example of a photonic crystal is found on page 222 of that paper, FIG. 15. The figure also contains information regarding the production of that photonic crystal.

Also of interest in this context is a paper by R. D. Meade et al., "Novel Applications of Photonic Band Gap-Materials: Low-loss Bends and High Q Cavities", Journal of Applied Physics 75 (1994) 4753. That paper shows cavity resonators and waveguides which are bounded by photonic crystals.

A photonic crystal conventionally requires an open form that is constructed in a comparatively complex manner. In addition, there is a desire to produce such an open form from a material of the kind used for electronic semiconductor components, and thus to enable integration of the technology of photonic crystals with the technology of semiconductor optoelectronics.

SUMMARY OF THE INVENTION

It is accordingly an object of the invention to provide a method of producing an open form, which overcomes the above-mentioned disadvantages of the heretofore-known devices and methods of this general type and which can be composed of a plurality of in each case two-dimensionally structured layers and is composed of a material which can be etched in dependence of its doping.

With the foregoing and other objects in view there is provided, in accordance with the invention, a method of producing an open form composed of a plurality of layers each structured with a two-dimensional pattern, the open form being made of silicon that can be etched depending on a doping. The method comprises the following steps:

providing a first layer of silicon, and marking a portion of the first layer belonging to a form to be produced, by doping at least one zone of the first layer, and leaving unmarked portions;

applying a further layer of silicon, and marking a portion of the further layer belonging to the form to be produced, by doping at least one zone of the further layer, and leaving unmarked portions, each doping process producing p-type conductivity with a doping atom concentration above $10^{15}$ per $cm^3$ in the silicon; and removing all unmarked portions by etching with an alkaline etching liquid, containing ethylene diamine and pyrocatechol, depending on a respective doping of each layer.

The open form to be produced is structured in such a way that it can be composed of in each case two-dimensionally structured layers. Structuring of a layer is deemed to be two-dimensional when it is homogeneous along a thickness direction of the layer; thus, the structure is an essentially planar structure. By corresponding doping of each layer, each layer portion belonging to the form is marked and thereby prepared for the etching process which releases the open form to be produced from the complex of layers which is homogeneous except for the doping. The dopings can either facilitate the etching of the material (the open form is then produced from the material left undoped) or make it more difficult (the open form is then produced from the doped material). There are, moreover, no fundamental limitations with regard to the application of the at least one further layer to the first layer. A further layer may either be grown, that is to say produced directly on the substrate already present by phase transformation, or be produced as an initially separate solid, if appropriate already doped as desired, and be connected to the substrate already present by subsequent "wafer bonding". A wide variety of etching methods which allow selective etching of a material depending on a doping are well known in the field of the technology of electronic semiconductors. In the instant case it is silicon that is to be etched and the etching can be adapted to the respective doping.

In accordance with an added feature of the invention, the further layer is formed with a growth process. In this case, furthermore, it is preferable for the first layer to be provided as a single crystal and each further layer to be grown epitaxially, that is to say with continuation of the monocrystalline structure.

In accordance with an additional feature of the invention, before each doping process, the corresponding layer is covered with a mask outside each zone and the mask is removed directly after the doping process.

As noted above, the material of the open form is silicon. The doping process can be effected with the production of p-type conductivity in the silicon, particularly preferably by the introduction of boron. It is additionally preferred, in the case of each doping process, to produce a concentration of doping atoms, thus in particular boron, above $10^{15}$ per $cm^3$, preferably above $10^{20}$ per $cm^3$, in the material. The etching can then be effected by an alkaline etching liquid; an exemplary embodiment in this regard will be explained. Marking the portions belonging to the open form by p-conductive doping has the advantage that the p-conductively doped silicon is usually dissolved by means of an alkaline etching liquid to a significantly lesser extent than undoped silicon.

In the method, an open form is preferably produced with a structure which is periodically repeated at most four times. This is of particular importance when the open form to be produced is a-photonic crystal, because the functioning of a photonic crystal can be detrimentally affected if the production-dictated dimensional tolerances of a structure that is repeated too often become apparent to an excessively great extent.

A preferred development of the method provides for each doping process to be effected by means of a masking method which is well known in the technology of electronic semiconductor components. In this case, before each doping process, a mask covering the corresponding layer outside each zone to be doped is applied, then the desired doping is performed and the mask is removed again directly after the doping process.

As noted above, the form to be produced is preferably a photonic crystal.

Other features which are considered as characteristic for the invention are set forth in the appended claims.

Although the invention is illustrated and described herein as embodied in a method for the production of an open form, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
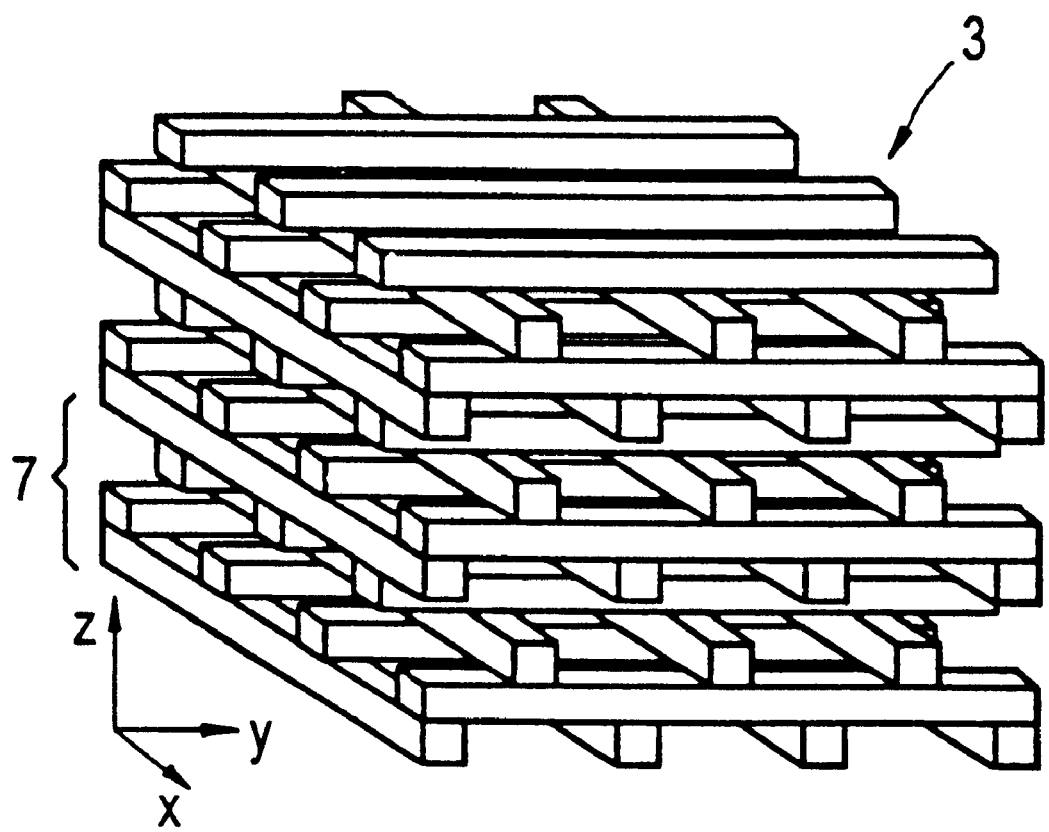
FIG. 1 is a perspective view of an open form produced as described herein and suitable as a photonic crystal.

Referring now to the figures of the drawing in detail and first, particularly, to FIG. 1 thereof, there is seen a perspective view of the open form 3 that is to be produced. The open form constitutes a photonic crystal. This open form 3 may be regarded as a layering of planar arrangements of bars and, accordingly, can be broken down, in a clearly discernible mariner into in each case two-dimensionally structured layers lying one on top of the other along the Z-axis of the Cartesian coordinate system indicated in the lower left corner of the figure. It can also be seen that the open form has a periodically recurring structure 7 comprising four directly successive layers. It should be noted that the illustrated periodicity of the open form 3 is not a necessary precondition, because wave-guiding structures after the manner of a waveguide or optical cavity resonator can be realized in the open form 3 precisely by means of isolated or continued breaks in the periodicity. The open form 3 is dimensioned in such a way that it fulfills the intended function as a photonic crystal for photons in the infrared spectral region.

Using the example of the production of a single structure 7 which is repeated periodically, as mentioned, in the open form 3, the method according to the invention will now be explained with reference to FIGS. 2 to 5.

Figure 2:
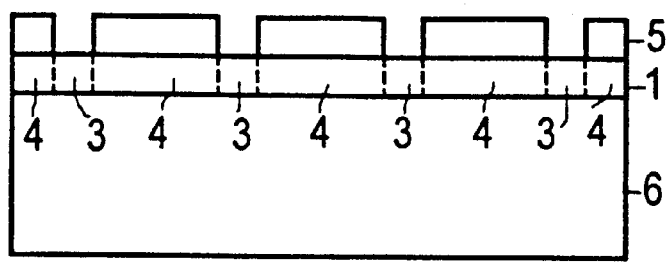
FIGS. 2 to 5 are diagrammatic side views showing the production of the open form of FIG. 1.
Figure 3:
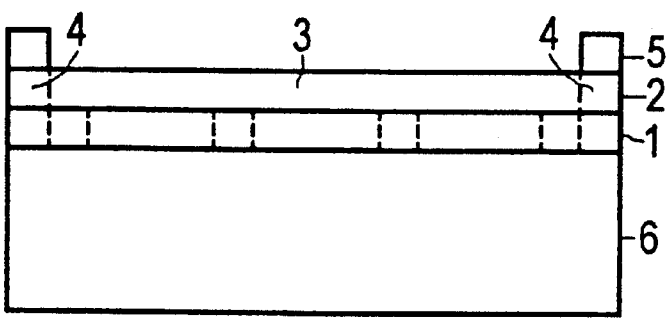
Figure 4:
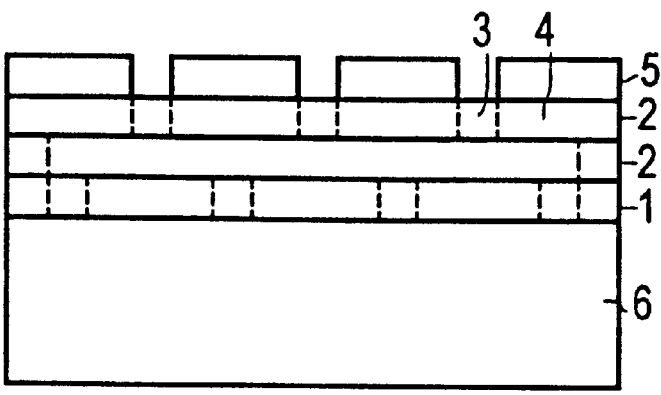
Figure 5:
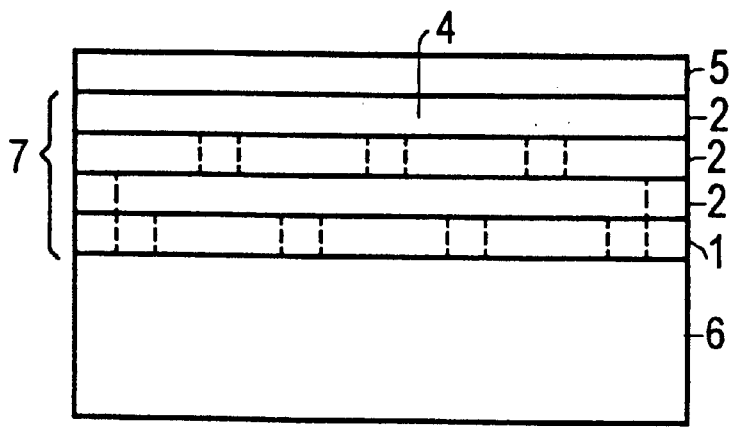

With reference to FIG. 2, the starting point is a monocrystalline, undoped substrate 6 made of silicon. A first layer 1 is produced on the substrate 6 by epitaxial growth. The first layer is made of initially undoped silicon. A structured mask 5 is applied to the first layer 1 in a conventional manner, and, with the assistance of the mask 5, those portions 3 of the first layer 1 which belong to the open form to be produced are doped with boron to form p-type conductivity. This doping is effected in a manner such that the criteria that are referred to above as being preferred are met. Zones 4 of the first layer 1 which are covered by the mask 5 are left undoped. Subsequently, the mask 5 is removed, and a further layer 2, likewise composed of initially undoped silicon, is grown on the first layer 1, once again epitaxially in order to maintain and continue the monocrystalline structure that is originally present. A structured mask 5 is once again applied to the further layer 2, as illustrated in FIG. 3. A single visible zone 3 to be doped is left free by the mask 5. Zones 4 that are left undoped are situated merely at the edges of the further layer 2. Once the further layer 2 has been doped, the mask 5 is removed and once again a further layer 2 is grown and provided with a new structured mask 5, see FIG. 4. After the doping of the layer 2 and the removal of the mask 5, another further layer 2 is grown and another new mask 5 is applied, see FIG. 5. As can be freely seen from FIG. 1 the corresponding layer of the open form 3, the mask 5 completely covers the upper further layer 2 in the view as shown in FIG. 5. Consequently, this layer 2 remains completely undoped at the location illustrated.

After the removal of the mask 5 illustrated in FIG. 5, the structure 7 which is periodically repeated in the desired open form 3 has been completely produced, admittedly only as a complex connected doped matrix in an otherwise undoped simply connected monolith composed of silicon. By repeating the sequence of process steps that can be discerned from FIGS. 2 to 5, it is possible to realize the structure 7 anew, and in any desired number. As already explained, it is preferred that the number of repetitions not be chosen to be too large; more than five repetitions can, under certain circumstances, impair the functioning of the open form 3 due to production tolerances which then have an excessively severe effect. Accordingly, FIG. 1 shows just three structures 7 arranged one above the other.

After all of the desired further layers 2 have been applied and doped as desired, the last process step that is effected is that the open form 3 is released from the monolith that is obtained in the first instance. To that end, the monolith is etched in a manner that is well known from the technology of semiconductor electronics, by etching with an alkaline etching liquid, the etching liquid containing ethylene diamine and pyrocatechol as active constituents. As is known, such an etching liquid exhibits a distinct variation in the etching of silicon doped with boron, provided that the doping has a concentration of doping atoms above $10^{15}$ per $cm^3$. The difference in the etching rates between boron-doped silicon with a doping of more than $10^{20}$ per $cm^3$ and boron-doped silicon with a doping of less than $10^{19}$ per $cm^3$ can reach a factor of 1000. Consequently, an outstanding method is available with can be used to release undoped silicon from the monolith without doped silicon being attacked to a significant extent. Consequently, all undoped silicon can be removed from the doped matrix, and after the etching process has been completed, all that is left is the doped matrix, and this is the desired open form 3 constructed from doped silicon.

We claim:

1. A method of producing an open form composed of a plurality of layers each structured with a two-dimensional pattern, the open form being made of silicon that can be etched depending on a doping, the method which comprises the following steps:

providing a first layer of silicon, and marking a portion of the first layer belonging to a form to be produced, by doping at least one zone of the first layer, and leaving unmarked portions;

applying at least one further layer of silicon using a growth process, and marking a portion of the further layer belonging to the form to be produced, by doping at least one zone of the further layer, and leaving unmarked portions;

removing all unmarked portions by etching with an alkaline etching liquid, depending on a respective doping of each layer; and after applying and marking all further layers of silicon, performing the step of removing all of the unmarked portions such that the unmarked portions are simultaneously removed from all layers.

2. The method according to claim 1, wherein the first layer is a single crystal and each further layer is grown epitaxially.

3. The method according to claim 1, wherein each doping process comprises doping with boron.

4. The method according to claim 1, wherein the open form is produced with a structure that is periodically repeated at most four times.

5. The method according to claim 1, which comprises, before each doping process, covering a corresponding layer with a mask outside each zone and removing the mask directly after the doping process.

6. The method according to claim 1, wherein the open form is a photonic crystal.

7. The method according to claim 1, wherein each doping process produces p-type conductivity with a given doping atom concentration above $10^{15}$ per $cm^3$ in the silicon.

8. The method according to claim 1, wherein each doping process produces p-type conductivity with a concentration of doping atoms above $10^{20}$ per $cm^3$ in the silicon.

9. The method according to claim 1, wherein the etching liquid contains ethylene diamine and pyrocatechol.

* * * * *